(12) United States Patent
Poe et al.

(10) Patent No.: US 8,017,698 B2
(45) Date of Patent: Sep. 13, 2011

(54) SOLAR PANEL WITH POLYMERIC COVER

(75) Inventors: Garrett Poe, Madison, AL (US);
Brandon Farmer, Knoxville, TN (US)

(73) Assignee: NeXolve Corporation, Huntsville, AL (US)

( * ) Notice: Subject to any disclaimer, the term of this patent is extended or adjusted under 35 U.S.C. 154(b) by 116 days.

(21) Appl. No.: 12/619,633

(22) Filed: Nov. 16, 2009

(65) Prior Publication Data

US 2010/0101628 A1 Apr. 29, 2010

Related U.S. Application Data

(63) Continuation-in-part of application No. 11/972,768, filed on Jan. 11, 2008, now Pat. No. 7,619,042.

(60) Provisional application No. 60/970,571, filed on Sep. 7, 2007.

(51) Int. Cl.
*C08F 283/00* (2006.01)
*C08F 283/04* (2006.01)

(52) U.S. Cl. ........ 525/418; 525/421

(58) Field of Classification Search .......... None
See application file for complete search history.

(56) References Cited

U.S. PATENT DOCUMENTS

| | | | |
|---|---|---|---|
| 5,591,250 A * | 1/1997 | Stern et al. ........ | 95/51 |
| 6,680,363 B2 * | 1/2004 | Hosokawa et al. ....... | 528/170 |
| 6,767,930 B1 * | 7/2004 | Svejda et al. ........ | 521/134 |
| 7,619,042 B2 | 11/2009 | Poe et al. | |
| 2003/0220188 A1 * | 11/2003 | Marand et al. ......... | 502/60 |
| 2007/0276086 A1 * | 11/2007 | Shih et al. ....... | 524/600 |
| 2008/0173349 A1 * | 7/2008 | Liu et al. ........ | 136/256 |
| 2009/0092759 A1 * | 4/2009 | Chen et al. ......... | 427/384 |

FOREIGN PATENT DOCUMENTS

JP 2005232024 A * 9/2005

OTHER PUBLICATIONS

Hoflund et al. "In-Sity Oxygen-Atom Erosion Study of a Polyhedral Oligomeric Silsesquioxane Polyurethane Copolymer" 29 pages, 2000.*
Mark J. O'Neill "1,000 W/kg Solar Concentrator Arrays for Far-Term Space Missions" 8 pages, 2004.*
Tomczak et al. "The Effect of Atomic Oxygen on POSS-Polyimides" 16 pages, 2008.*
Walters et al. "Forward Technology Solar Cell Experiment First On-Orbit Data", 16 pages, 2008.*

(Continued)

*Primary Examiner* — Robert Loewe
(74) *Attorney, Agent, or Firm* — Mark Swanson; Bradley Arent Boult Cummings

(57) ABSTRACT

A solar panel has a face which can be directed towards the sun for generating heat or electricity. The solar panel face is protected by a polymeric coating. The polymeric coating includes a polyimide polymer made by reacting at least one acid monomer with at least one diamine monomer to form the polyimide polymer backbone. The monomers are selected such that the polyimide backbone includes at least one non-terminal attachment point. An oligomeric silsesquioxane compound is attached to the polyimide backbone by reacting a functional group to the attachment point, where the functional group is connected to the oligomeric silsesquioxane compound. The polymeric compound can provide a relatively lightweight protective layer for the solar panel, which can reduce the total weight of the solar panel.

20 Claims, 8 Drawing Sheets

OTHER PUBLICATIONS

Tomczak et al. "Properties and Improved Space Survivability of POSS (Polyhedral Oligomeric Silsesquioxane) Polyimides", 14 pages, 2004.*

Tomczak et al. "Synthesis and Characterization of Space-Survivable POSS-Kapton-Polyimides" 16 pages, 2007.*

English-language machine-generated translation of JP-2005232024, 19 pages, translation generated on Jul. 2009.*

Vijh et al. "Film Adhesion in Triple Junction a-Si Solar Cells on Polyimide Substrates", IEEE, 2005, 611-613.*

Mantech SRS Technologies,"Mantech SRS Technologies Develops New High Tech Space Plastic Using Poss® Nanotechnology" Mar. 2008, [online] [retrieved on Oct. 3, 2010], retrieved from Mantech SRS Technologies website using Internet <URL: http://www.mantechmterials.com/news.asp?NID=2>.

* cited by examiner

SOLAR PANEL WITH POLYMERIC COVER

The present application is a continuation in part of, and claims priority from, non-provisional U.S. patent application Ser. No. 11/972,768, filed Jan. 11, 2008, where U.S. patent application Ser. No. 11/972,768 claims priority from provisional U.S. Patent Application 60/970,571, filed Sep. 7, 2007. The content of both U.S. patent application Ser. No. 11/972,768 and U.S. Patent Application 60/970,571 are hereby incorporated by reference.

BACKGROUND OF THE INVENTION

1. Field of the Invention

The invention relates to solar panels. In particular, this invention relates to solar panels protected with a polymeric covering.

2. Description of the Related Art

Polyimides are an important class of polymeric materials and are known for their superior performance characteristics. These characteristics include high glass transition temperatures, good mechanical strength, high Young's modulus, good UV durability, and excellent thermal stability. Most polyimides are comprised of relatively rigid molecular structures such as aromatic/cyclic moieties.

As a result of their favorable characteristics, polyimide compositions have become widely used in many industries, including the aerospace industry, the electronics industry and the telecommunications industry. In the electronics industry, polyimide compositions are used in applications such as forming protective and stress buffer coatings for semiconductors, dielectric layers for multilayer integrated circuits and multi-chip modules, high temperature solder masks, bonding layers for multilayer circuits, final passivating coatings on electronic devices, and the like. In addition, polyimide compositions may form dielectric films in electrical and electronic devices such as motors, capacitors, semiconductors, printed circuit boards and other structures. Polyimide compositions may also serve as an interlayer dielectric in both semiconductors and thin film multichip modules. The low dielectric constant, low stress, high modulus, and inherent ductility of polyimide compositions make them well suited for these multiple layer applications. Other uses for polyimide compositions include alignment and/or dielectric layers for displays, and as a structural layer in micromachining applications.

In the aerospace industry, polyimide compositions have been used for optical applications as membrane reflectors. In application, a polyimide composition is secured by a metal (often aluminum, copper, or stainless steel) or composite (often graphite/epoxy or fiberglass) mounting ring that secures the border of the polyimide compositions. Such optical applications may be used in space, where the polyimide compositions and the mounting ring are subject to repeated and drastic heating and cooling cycles in orbit as the structure is exposed to alternating periods of sunlight and shade. Satellites can remain in orbit for extended periods, so the materials used should survive as long as the satellite remains functional.

Polyimide polymers are subject to rapid degradation in a highly oxidizing environment, such as an oxygen plasma or atomic oxygen [AO], as are most hydrocarbon- and halocarbon-based polymers. AO is present in low earth orbit [LEO], so many spacecraft experience this highly oxidizing environment. The interactions between the oxidizing environment and the polymer material can erode and reduce the thickness of the polymer material. To protect from erosion, protective coatings including metals, metal oxides, ceramics, glasses, and other inorganic materials can be applied as surface treatments to polyimides subjected to the oxidizing environment.

While these coatings are effective at minimizing the oxidative degradation of the underlying material, they often experience cracking from thermal and mechanical stresses, mechanical abrasion, and debris impact. After cracking, the protective surface is compromised and the underlying polymeric material can be degraded from additional exposure to the oxidizing environment. Therefore, the availability of polymers which are able to resist AO degradation is very desirable.

Oligomeric silsesquioxanes [OS] can be incorporated into a polyimide matrix to improve the durability of polyimides in these environments. Polyimides with incorporated OS demonstrate excellent resistance to AO degradation prevalent in LEO environments. Polyimides with incorporated OS provide additional benefits as well. Polyhedral OS are referred to by the trademark POSS™, and are a common form of OS.

Solar panels are often used to generate electrical power for an aircraft, airship, spacecraft, or satellite. Many solar panels use a semiconductor, such as silicon, in a photovoltaic (PV) structure to convert light from the sun or from other light sources into electricity. These solar panels are often protected with a glass cover on the face directed towards the sun. The glass cover provides a protective barrier for the PV components. This glass cover protects the PV components from degrading upon exposure to many things, including atmospheric moisture, oxygen, atomic oxygen, sulfur, contaminants, and many other sources of degradation. The PV components can be exposed and degraded during assembly, ground handling, integration, and flight. The glass cover exhibits high optical clarity which allows the transmission of light to the underlying components, where the light is converted to electrical energy. A glass cover can be significantly thicker than a polymeric coating, and greater thickness tends to result in greater weight.

Glass covers are relatively heavy compared to polymeric materials where glass can have densities greater than 2.0 grams per cubic centimeters and often greater than 2.5 grams per cubic centimeter. There are many different types of glass, and the selection process for the type of glass used can involve many considerations. The cost per unit weight of delivering a vehicle, cargo, and payload into service is high. Reducing the cargo weight prior to launching into service can save costs, or allow for additional components to be included with the launch. Glass protective covers for solar panels are rigid and brittle, and they can break or crack from movement during ground handling, assembly, launch, the unfurling of a solar array, contact with debris or micro-meteorites, or from a wide variety of other causes. A glass cover may provide reduced protection once broken or cracked, and may also reduce the amount of light striking the PV components.

SUMMARY OF THE INVENTION

A solar panel includes a face for collecting sunlight. A polymeric coating covers the face, where the polymeric coating includes a polyimide polymer. The polyimide polymer in the polymeric coating has a backbone with at least one non-terminal phenyl group. A linkage is connected to the non-terminal phenyl group, where the linkage can be an amide linkage or an ester linkage. An oligomeric silsesquioxane compound is connected to the linkage through an organic substituent, where the oligomeric silsesquioxane is not incor-

NOTE: The use of waved lines "∿∿∿"indicates the molecule continues, but does not necessarily repeat. The use of square brackets "[" and/or "]" indicates that the structure repeats beyond the bracket. The use of round brackets "(" and/or ")" indicates substructures within a repeat unit and does not indicate the substructure repeats beyond the round brackets. In this description, an atom AA shown connected to a phenyl group through a bond, instead of at the angles representing carbon atoms, is meant to depict the atom AA connects to any available carbon atom in the phenyl group, and not to a specific carbon atom. Therefore, such a drawing does not specifically denote an ortho, meta, or para positioning of the bond to the AA atom.

DETAILED DESCRIPTION

Polyimide

Polyimides are a type of polymer with many desirable characteristics. In general, polyimide polymers include a nitrogen atom in the polymer backbone, wherein the nitrogen atom is connected to two carbonyl carbons, such that the nitrogen atom is somewhat stabilized by the adjacent carbonyl groups. A carbonyl group includes a carbon, referred to as a carbonyl carbon, which is double bonded to an oxygen atom. Most polyimides are considered an AA-BB type polymer because two different classes of monomers are used to produce the polyimide polymer. One class of monomer is called an acid monomer, and is usually in the form of a dianhydride. The other type of monomer is usually a diamine, or a diamino monomer. Polyimides may be synthesized by several methods. In the traditional two-step method of synthesizing aromatic polyimides, a polar aprotic solvent such as N-methylpyrrolidone (NMP) is used. First, the diamino monomer is dissolved in the solvent, and then a dianhydride monomer is added to this solution. The diamine and the acid monomer are generally added in approximately a 1:1 molar stoichiometry.

Figure 1:
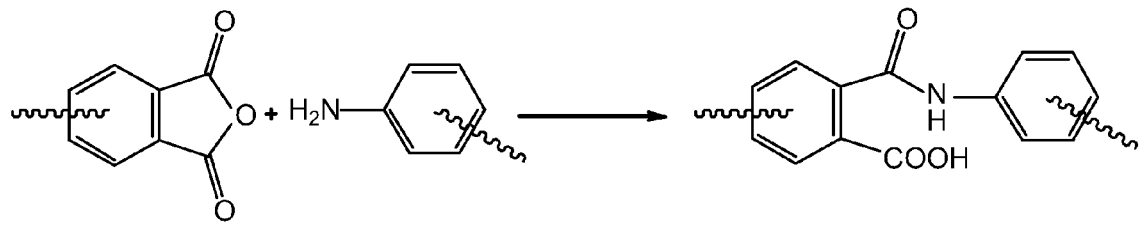
FIG. 1 depicts the formation of an amic acid.
Figure 2:
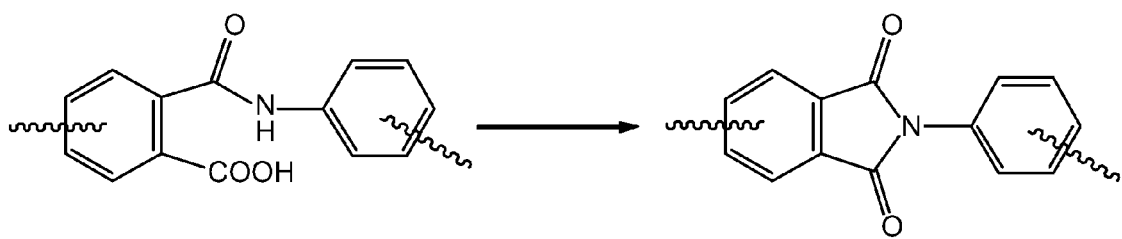
FIG. 2 depicts the formation of an imide bond from an amic acid.

Because one dianhydride monomer has two anhydride groups, different diamino monomers can react with each anhydride group so the dianhydride monomer may become located between two different diamino monomers. The diamine monomer contains two amine functional groups; therefore, after one amine attaches to the first dianhydride monomer, the second amine is still available to attach to another dianhydride monomer, which then attaches to another diamine monomer, and so on. In this matter, the polymer backbone is formed. The resulting polycondensation reaction forms a polyamic acid. The reaction of an anhydride with an amine to form an amic acid is depicted in FIG. 1. The high molecular weight polyamic acid produced is soluble in the reaction solvent and, thus, the solution may be cast into a film on a suitable substrate such as by flow casting. The cast film can be heated to elevated temperatures in stages to remove solvent and convert the amic acid groups to imides with a cyclodehydration reaction, also called imidization. Alternatively, some polyamic acids may be converted in solution to soluble polyimides by using a chemical dehydrating agent, catalyst, and/or heat. The conversion of an amic acid to an imide is shown in FIG. 2.

The polyimide polymer is usually formed from two different types of monomers, and it is possible to mix different varieties of each type of monomer. Therefore, one, two, or more dianhydride-type monomers can be included in the reaction vessel, as well as one, two or more diamino monomers. The total molar quantity of dianhydride-type monomers is kept about the same as the total molar quantity of diamino monomers. Because more than one type of diamine or dianhydride can be used, the exact form of each polymer chain can be varied to produce polyimides with desirable properties.

For example, a single diamine monomer AA can be reacted with two dianhydride comonomers, $B_1B_1$ and $B_2B_2$, to form a polymer chain of the general form of $(AA-B_1B_1)_x$-$(AA-B_2B_2)_y$, in which x and y are determined by the relative incorporations of $B_1B_1$ and $B_2B_2$ into the polymer backbone. Alternatively, diamine comonomers $A_1A_1$ and $A_2A_2$ can be reacted with a single dianhydride monomer BB to form a polymer chain of the general form of $(A_1A_1$-$BB)_x$-$(A_2A_2$-$BB)_y$. Additionally, two diamine comonomers $A_1A_1$ and $A_2A_2$ can be reacted with two dianhydride comonomers $B_1B_1$ and $B_2B_2$ to form a polymer chain of the general form $(A_1A_1$-$B_1B_1)_w$-$(A_1A_1$-$B_2B_2)_x$-$(A_2A_2$-$B_1B_1)_y$-$(A_2A_2$-$B_2B_2)$, where w, x, y, and z are determined by the relative incorporation of $A_1A_1$-$B_1B_1$, $A_1A_1$-$B_2B_2$, $A_2A_2$-$B_1B_1$, and $A_2A_2$-$B_2B_2$ into the polymer backbone. Therefore, one or more diamine monomers can be polymerized with one or more dianhydrides, and the general form of the polymer is determined by varying the amount and types of monomers used.

The dianhydride is only one type of acid monomer used in the production of AA-BB type polyimides. Et is possible to used different acid monomers in place of the dianhydride. For example, a tetracarboxylic acid with four acid functionalities, a tetraester, a diester acid, or a trimethylsilyl ester could be used in place of the dianhydride. In this description, an acid monomer refers to either a dianhydride, a tetraester, a diester acid, a tetracarboxylic acid, or a trimethylsilyl ester. The other monomer is usually a diamine, but can also be a diisocyanate. Polyimides can also be prepared from AB type monomers. For example, an aminodicarboxylic acid monomer can be polymerized to form an AB type polyimide.

The characteristics of the polyimide polymer are determined, at least in part, by the monomers used in the preparation of the polymer. The proper selection and ratio of monomers are used to provide the desired polymer characteristics. For example, polyimides can be rendered soluble in organic solvents by selecting the monomers that impart solubility into the polyimide structure. It is possible to produce a soluble polyimide polymer using some monomers that tend to form insoluble polymers if the use of the insoluble monomers is balanced with the use of sufficient quantities of soluble monomers, or through the use of lower quantities of especially soluble monomers. The term especially soluble monomers refers to monomers which impart more of the solubility characteristic to a polyimide polymer than most other monomers. Some soluble polyimide polymers are soluble in relatively polar solvents, such as dimethyl acetamide, dimethylformamide, dimethylsulfoxide, tetrahydrofuran, acetone, methyl ethyl ketone, methyl isobutyl ketone, and phenols, as well as less polar solvents, including chloroform, and dichloromethane. The solubility characteristics and concentrations of the selected monomers determine the solubility characteristics of the resultant polymer. For this description, a polymer is soluble if it can be dissolved in a solvent to form at least a 1 percent solution of polymer in solvent, or more preferably a 5 percent solution, and most preferably a 10 percent or higher solution.

Most, but not all, of the monomers used to produce polyimide polymers include aromatic groups. These aromatic groups can be used to provide an attachment point on the polymer backbone for a tether. A tether refers to a chain including at least one carbon, oxygen, sulfur, phosphorous, or silicon atom that is used to connect the polymer backbone to another compound or sub-compound. Therefore, if the polymer backbone were connected through the para position on a phenyl group, wherein the para position refers to the number 1 and the number 4 carbons on the benzene ring, the ortho and meta positions would be available to attach a tether to this polymer backbone. The ortho position to the number 1 carbon refers to the number 2 and number 6 carbons, whereas the meta position to the number 1 carbon refers to the number 3 and number 5 carbons.

Many polyimide polymers are produced by preparing a polyamic acid polymer in the reaction vessel. The polyamic acid is then formed into a sheet or a film and subsequently processed with heat (often temperatures higher than 250 degrees Celsius) or both heat and catalysts to convert the polyamic acid to a polyimide. However, polyamic acids are moisture sensitive, and care must be taken to avoid the uptake of water into the polymer solution. Additionally, polyamic acids exhibit self-imidization in solution as they gradually convert to the polyimide structure. The imidization reaction generally reduces the polymer solubility and produces water as a by-product. The water produced can then react with the remaining polyamic acid, thereby cleaving the polymer chain. Moreover, the polyamic acids can generally not be isolated as a stable pure polymer powder. As a result, polyamic acids have a limited shelf life.

Sometimes it is desirable to produce the materials for a polyimide polymer film, but wait for a period of time before actually casting the film. For this purpose, it is possible to store either a soluble polyimide or a polyamic acid. Soluble polyimides have many desirable advantages over polyamic acids for storage purposes. Soluble polyimides are in general significantly more stable to hydrolysis than polyamic acids, so the polyimide can be stored in solution or it can be isolated by a precipitation step and stored as a solid material for extended periods of time. If a polyamic acid is stored, it will gradually convert to the polyimide state and/or hydrolytically depolymerize. If the stored material becomes hydrolytically depolyermized, it will exhibit a reduction in solution viscosity, and if the stored material converts to the polyimide state, it will become gel-like or a precipitated solid if the polyimide is not soluble in the reaction medium. This reduced viscosity solution may not exhibit sufficient viscosity to form a desired shape, and the gel-like or solid material cannot be formed to a desired shape. The gradual conversion of the polyamic acid to the polyimide state generates water as a byproduct, and the water tends to cleave the remaining polyamic acid units. The cleaving of the remaining polyamic acid units by the water is the hydrolytic depolymerization referred to above. Therefore, the production of soluble polyimides is desirable if there will be a delay before the material is formed for final use.

Soluble polyimides have advantages over polyamic acids besides shelf life. Soluble polyimides can be processed into usable work pieces without subjecting them to the same degree of heating as is generally required for polyamic acids. This allows soluble polyimides to be processed into more complex shapes than polyamic acids, and to be processed with materials that are not durable to the 250 degree Celsius minimum temperature typically required for imidizing polyamic acids. To form a soluble polyimide into a desired film, the polyimide is dissolved in a suitable solvent, formed into the film as desired, and then the solvent is evaporated. The film solvent can be heated to expedite the evaporation of the solvent.

Oligomeric Silsesquioxane

Figure 3:
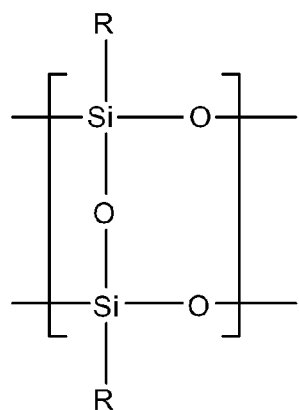
FIG. 3 depicts an oligomeric silsesquioxane (OS) compound.
Figure 4:
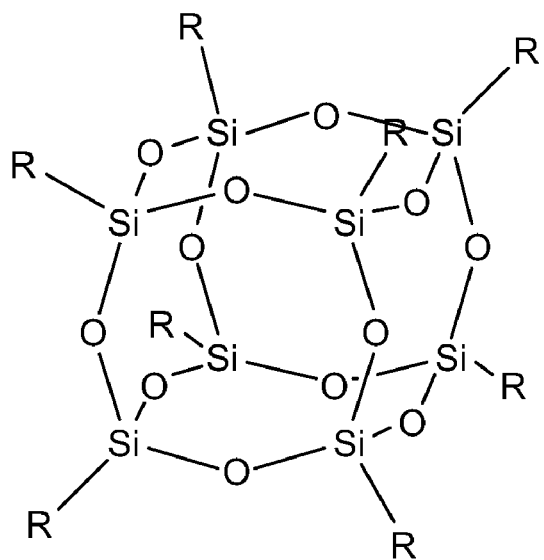
FIG. 4 depicts a polyhedral shaped OS compound.

OS compounds or groups are characterized by having the general formula of $[RSi]_n[O_{1.5}]_n$ wherein the R represents an organic substituent and the Si and the O represent the chemical symbols for the elements silicon and oxygen. R can be aliphatic or aromatic, and includes a wide variety of organic compounds. The silicon atoms are connected together through the oxygen atoms, with the R groups connected to the silicon atoms, as seen in FIG. 3. These OS compounds have hybrid organic and inorganic properties. The Si—O groupings provide the inorganic properties, and the attached R groups provide the organic properties. Frequently, these OS compounds exist in a cage form such that a polyhedron is created by the silicon and oxygen atoms, as shown in FIG. 4. When the OS compound is in the cage form or the polyhedral form, the R groups are exterior to the cage, with the Si atoms generally forming corners of the cage.

Frequently, the OS compound will have an organic substituent which has a functional group. These OS compounds can therefore have organic substituents with varying structures connected to the different Si atoms within a single OS compound. A typical example would be a polyhedral OS represented by the formula $[RSi]_{(n-1)}[R'A]_1[O_{1.5}]_n$, wherein R' symbolizes an organic substituent with a functional group which can be used to connect the OS compound to a polymer backbone or some other molecule. In this case, the A is used to represent an element. This element is usually Si, but can also be other elements, including aluminum (Al), boron (B), germanium (Ge), tin (Sn), titanium (Ti), and antimony (Sb). These different atoms incorporated into the OS compound provide different characteristics which will be imparted to the polymer.

Attaching an OS group to a polyimide polymer can affect many characteristics of the polymer, including oxidative stability, temperature stability, glass transition temperature, solubility, dielectric constant, tensile properties, thermomechanical properties, optical properties, and other properties. One significant characteristic improved by incorporation of OS in a polyimide polymer is increased resistance to degradation in oxidizing environments, such as oxygen plasma and AO, as discussed above. Oligomeric silsesquioxanes [OS] can be incorporated into a polyimide matrix to improve the durability of polyimides in these environments. Therefore, polyimide polymers with incorporated OS are desirable.

When a hydrocarbon or halocarbon polyimide that includes OS is exposed to an oxygen plasma or AO, the organic substituent portions of the OS oxidize into volatile products while the inorganic portion forms a passivating silica layer on the exposed surface of the polyimide polymer. This process is referred to as the glassification of the polymer. The silica layer tends to protect the underlying polyimide material from further degradation by the oxidizing environment. Additionally, the silica layer absorbs at least a portion of the ultraviolet [UV] light, especially the UV light with a wavelength shorter than about 256 nm. Therefore, the silica layer also protects the polymer film from radiation, because UV light is a form of electromagnetic radiation. Additionally, if the silica layer exhibits sufficient thickness, it reduces gas and water permeability through the polyimide film. It is possible to deposit additional silica on a polyimide film to produce the thickness necessary to significantly reduce gas and water permeability through the film.

OS has been blended with polymers to provide a degree of protection herein described, but the amount of OS which can be blended with a polymer is limited. Typically, the amount of OS incorporated into the polymer by blending methods is limited to a concentration where the OS compounds do not aggregate into domains large enough to scatter visible light. Incorporation of additional OS above this level typically results in a reduction in optical and/or mechanical properties. However, it has been found that chemically reacting the OS with the polymer reduces the OS aggregation and provides more uniform distribution of the OS within the polymer. As such, more OS can typically be incorporated into a polymer matrix via covalent bonding than by simpler blending methods. This results in a polymer which is better able to withstand exposure to oxygen plasma, AO, and UV radiation.

It is possible to attach the OS groups to a polyimide polymer by reacting the OS with one of the monomers before polymerization. In practice, however, this method is difficult owing to the high cost of OS and number of reaction and purification steps needed to obtain a usable monomer of sufficient purity. High monomer purity is required for the formation of sufficient molecular weight polyamic acids and polyimides. For example, others have described a method to incorporate a polyhedral OS into the polyimide backbone requiring four reaction steps. The fewer the reaction and purification steps, the lower the cost and the greater the efficiency of the entire process, as a general rule. Therefore, a method of producing a desired polymer with fewer reaction and purification steps is desirable, because such a method would probably reduce the cost and improve the overall efficiency of the process. The current disclosure describes a polyimide composition incorporating OS and a method of synthesizing that polymer that uses two reaction steps and zero to two purification steps.

Selection of Monomers

The characteristics of the final polymer are largely determined by the choice of monomers which are used to produce the polymer. Factors to be considered when selecting monomers include the characteristics of the final polymer, such as the solubility, thermal stability and the glass transition temperature. Other factors to be considered include the expense and availability of the monomers chosen. Commercially available monomers that are produced in large quantities generally decrease the cost of producing the polyimide polymer film since such monomers are in general less expensive than monomers produced on a lab scale and pilot scale. Additionally, the use of commercially available monomers improves the overall reaction efficiency because additional reaction steps are not required to produce a monomer which is incorporated into the polymer. One advantage of the current invention is the preferred monomers are generally produced in commercially available quantities, which can be greater than 10,000 kg per year.

One type of monomer used is referred to as the acid monomer, which can be either the tetracarboxylic acid, tetraester, diester acid, a trimethylsilyl ester, or dianhydride. The use of the dianhydride is preferred because it generally exhibits higher rates of reactivity with diamines than tetrafunctional acids, diester acids, tetraesters, or trimethylsilyl esters. Some characteristics to be considered when selecting the dianhydride monomer include the solubility of the final polymer as well as commercial availability of the monomers.

Certain characteristics tend to improve the solubility of the polyimide polymer. These characteristics include flexible spacers, so-called kinked linkages, and bulky substituents. The flexible spacer is an atom covalently bonded between two separate phenyl groups. The phenyl groups are relatively ridged, so the flexible spacer allows for increased motion between separate phenyl groups. Alkyl linkages are not as stable as the phenyl groups, so the use of simple hydrocarbon alkyl groups between phenyl groups can reduce the stability of the polymer. The stability of the overall polymer can be improved if the linkage is saturated with fluorine instead of hydrogen. Also, the use of other atoms, such as Oxygen or Silicon, can result in a more stable polymer.

The term kinked linkages refers to a meta connection on a phenyl group. This means the polymer backbone would be connected through a number 1 and number 3 carbon on a phenyl group. The use of kinked linkages, or meta linkages, in the polymer backbone tends to result in a higher coefficient of thermal expansion, as well as greater solubility.

Bulky substituents in the polymer also tend to increase the overall polymer solubility. Bulky substituents are compounds which are large and tend to interfere with intramolecular and intermolecular chain association because of their size. The bulky substituents can be included between phenyl groups in the backbone, connected directly to a phenyl group, or they can be tethered to the polymer backbone. The bulky substituents tend to reduce the ability of adjacent polymer chains to tightly associate. This tends to allow solvent molecules to enter between adjacent polymer chains, which increases the polymer solubility.

Urging phenyl groups in the backbone to align in different planes also tends to increase the polymer solubility, and bulky substituents can be used for this purpose. If two phenyl groups in the backbone are relatively close together, and each has a bulky substituent connected or tethered to it, those bulky substituents will sterically interfere with each other and tend to urge one phenyl group into a plane that is perpendicular to the plane of the other phenyl group.

Figure 5:
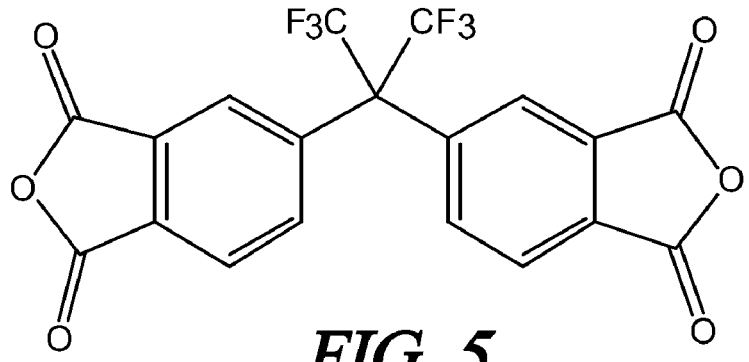
FIG. 5 depicts 4-4'-[hexafluoroisopropylidene]diphthalic anhydride [6-FDA]
Figure 6:
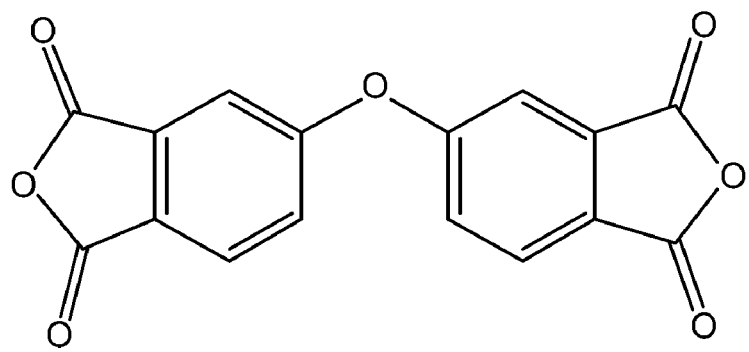
FIG. 6 depicts 4,4'-oxydiphthalic anhydride [ODPA]

The flexible spacers can be saturated with larger components such as fluorine to improve the solubility of the resulting polyimide polymer. Other preferred atoms for separating the phenyl groups include oxygen and sulfur. The preferred dianhydride monomers of the current invention are 6-FDA and ODPA, as seen in FIGS. 5 and 6, but other dianhydride monomers may also be used.

The OS group is usually attached to the diamine monomer owing to the greater availability of diamine architectures as compared to dianhydrides. Therefore, one of the diamine monomers used should have a functional group independent of the two amines, so when the two amines are incorporated into the polymer backbone the functional group is still available for a subsequent chemical reaction. This functional group is referred to as an attachment point because this is the point where the OS group is attached to the polymer backbone. A wide variety of attachment points can be used, but a carboxylic acid is preferred. The attachment point is incorporated into the length of the polymer backbone, not just at the ends or terminus of each chain, so that more OS compounds can be attached to the polymer. Therefore, the preferred attachment point is a carboxylic acid connected by a single bond to a phenyl group, wherein the phenyl group is non-terminal and the phenyl group is part of the polymer backbone.

Figure 7:
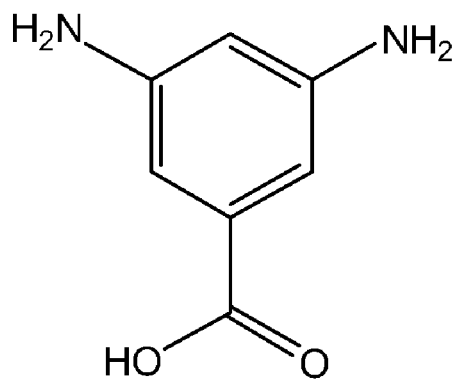
FIG. 7 depicts 1,3-diaminobenzoic acid [DBA]
Figure 8:
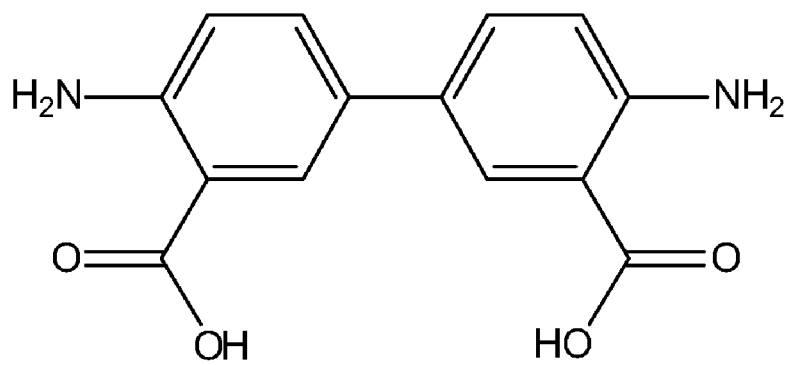
FIG. 8 depicts 4,4'-diaminobiphenyl-3,3'-dicarboxylic acid [DBDA].
Figure 9:
FIG. 9 depicts para-phenylene diamine [p-PDA]

The monomers DBA and DBDA, as shown in FIGS. 7 and 8, are utilized heavily because of the presence of a carboxylic acid group, which serve as attachment points for the OS groups. Other diamino monomers without a free attachment point can also be used. One example of such a monomer is p-PDA, as seen in FIG. 9. The higher the concentration of diamino monomers without an attachment point, the lower the concentration of diamino monomers with a free attachment point. Since the OS is primarily incorporated into the polymer through the attachment point, the overall concentration of OS compounds in the final polymer can be controlled by varying the ratio of diamino monomers with and without a free attachment point. Many other diamino monomers can be used, including but not limited to 2,2-bis[4-(4-aminophenoxy)phenyl]hexafluoropropane (BDAF), 1,3 bis(3-aminophenoxy)benzene (APB), 3,3-diaminodiphenyl sulfone (3,3-DDSO2), 4,4'-diaminodiphenylsulfone (4,4'-DDSO2), meta phenylene diamine (m-PDA), oxydianiline (ODA), the isomers of 4,4'-Methylenebis(2-methylcyclohexylamine) (MBMCHA), the isomers of 4,4'-Methylenebis(cyclohexylamine) (MBCHA), the isomers of 1,4-cyclohexyldiamine (CHDA), 1,2-diaminoethane, 1,3-diaminopropane, 1,4-diamonbutane, 1,5-diaminopentane, 1,6-diaminohexane, and diamonodurene (DMDE).

Any remaining free carboxylic acid groups at the end or terminus of a polymer chain also serve as attachment points. These terminal carboxylic acid groups are generally connected to a terminal phenyl group. Attachment points connected to non-terminal phenyl groups are needed to increase the ratio of OS incorporation into the final polymer. A non-terminal phenyl group is a phenyl group in the polymer backbone which is between two imide bonds in the polymer backbone.

Oligomeric Silsesquioxane Considerations

Incorporation of the OS group into the polymer matrix is often beneficial for the reasons previously described. Usually, the OS group is incorporated in a polyhedral cage structure, and the polyhedral OS is attached to the polymer. In such instances, the OS group will have at least one organic substituent with a functional group for attaching to the polymer. It is also possible for the polyhedral OS to have two or more functional groups, in which case it can be used as a monomer or as a crosslinking component. For example, a polyhedral OS group including two amine functional groups could be incorporated into the backbone of the polymer as a diamine monomer. Alternatively, if one OS functional group were to attach to a first polymer chain, the second OS functional group could attach to a different polymer chain, so the two polymer chains were cross-linked. The polymer chains can also be crosslinked by the inclusion of other organic substituents which will crosslink the polymer chains.

The current invention considers the attachment of the OS groups to the backbone by a tether such that these OS groups do not form part of the backbone of the polymer. This provides advantages as compared to incorporating the OS groups in line with the polymer backbone. One advantage of pendant attachment is that OS and polyhedral OS are rigid. When rigid OS is incorporated in line with the polymer backbone, it generally increases the material stiffness and ultimately limits the amount of polyhedral OS incorporated. By attaching the OS groups to the backbone by a tether, the bulk polymer stiffness is less affected with increasing levels of OS incorporation.

It is advantageous to use a tether when attaching an OS group to a polyimide polymer backbone. Steric factors favor the use of a tether because the OS group is usually bulky and the tether provides an attachment point apart from the bulk of the OS. The tether needs to be long enough to allow the OS group to react with the polyimide backbone, but it should be short enough to restrict the OS from aggregating into large domains that reduce the mechanical and optical properties. Keeping the OS group close to the attachment point provides for the OS being relatively evenly distributed throughout the polymer. Also, keeping the OS group close to the attachment point provides for a bulky constituent near the polymer backbone, which tends to improve the solubility of the polymer. Some desired properties of the tether itself include the provision of a stable and secure attachment, as well as many degrees of freedom of movement for the OS group. The tether can include functional groups, such as amides or esters. A tether or chain about 5 atoms long provides enough length to allow attachment while keeping the OS group close enough to the attachment point.

Figure 10:
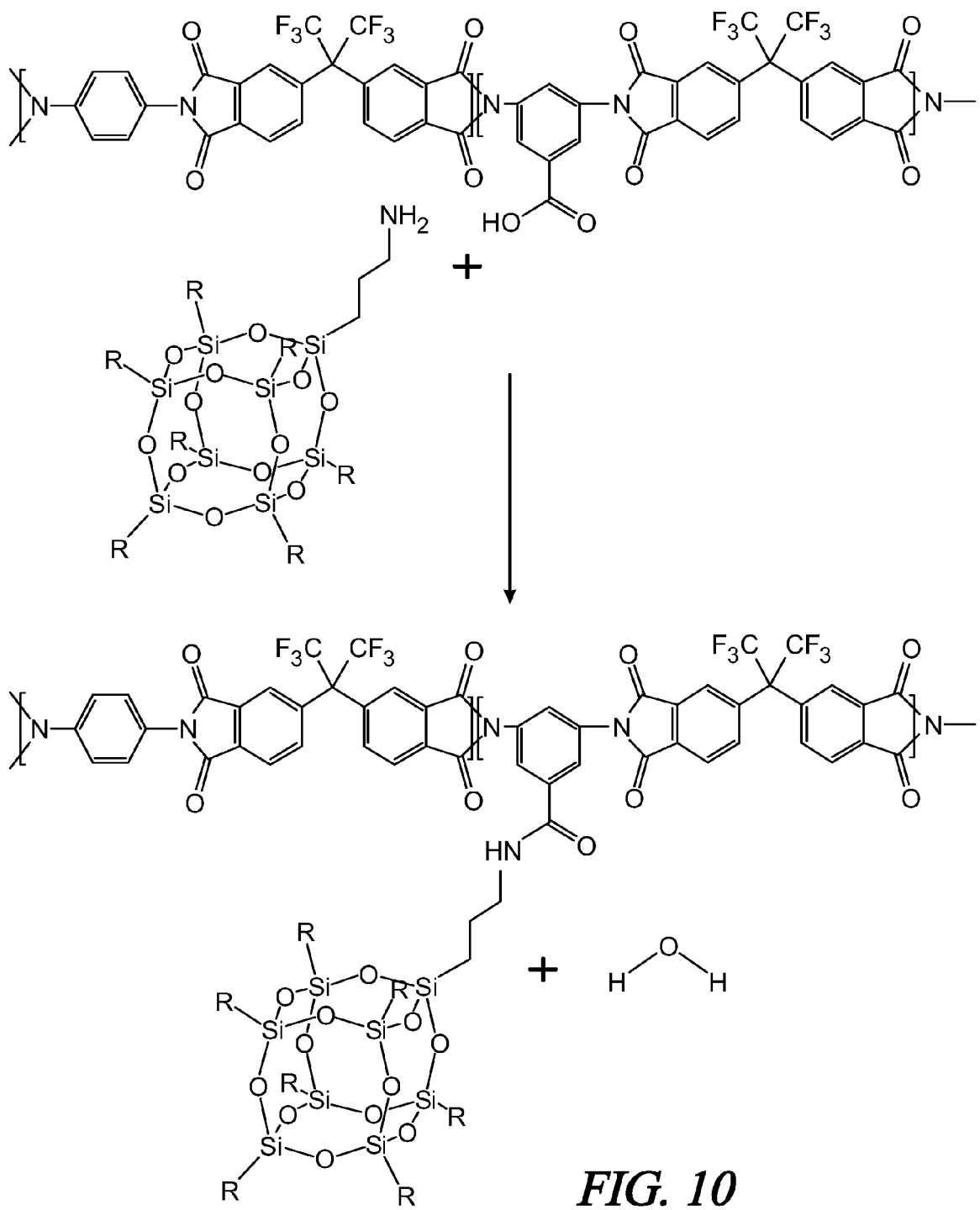
FIG. 10 depicts the formation of a tethering amide bond by the reaction of an amine with a carboxylic acid.
Figure 11:
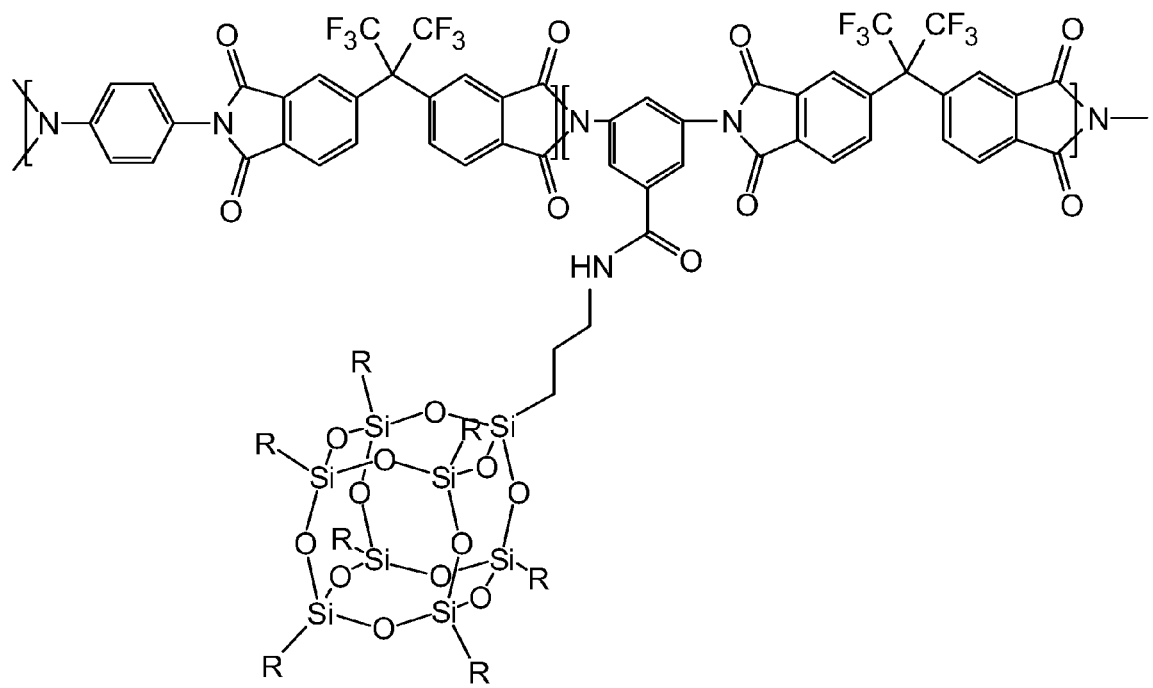
FIG. 11 depicts a section of a representative polyimide polymer with the OS connected with an amide.
Figure 12:
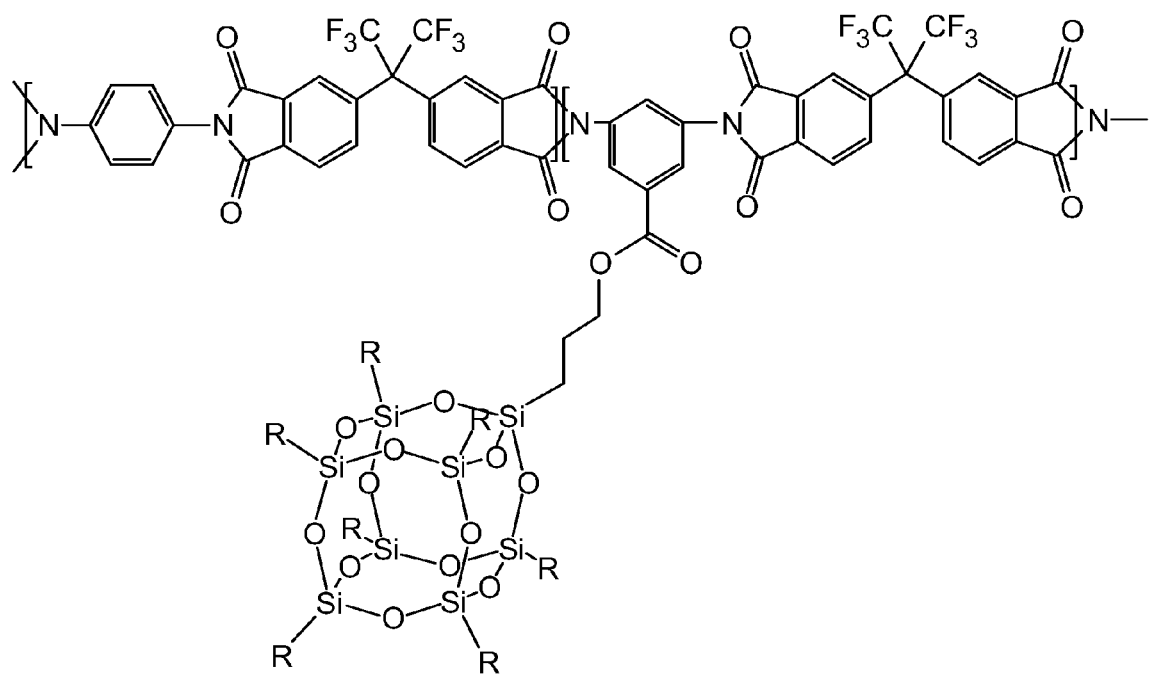
FIG. 12 depicts a section of a representative polyimide polymer with the OS connected with an ester.

Preferably, the OS compound will include one organic substituent with a functional group for attachment to the polymer backbone. This organic substituent becomes the tether connecting the polymer backbone to the OS compound. The preferred functional groups for this attachment are either an amine or an alcohol. The amine or alcohol on the OS compound reacts with a carboxylic acid on the polymer backbone to form an amide or ester connection, with the amide reaction shown in FIG. 10. The amide or ester thus formed includes either a carbonyl carbon and a linking nitrogen, as seen in FIGS. 10 and 11, or a carbonyl carbon and a linking oxygen, as seen in FIG. 12. The carbonyl carbon is connected by a single bond to a phenyl group, and the phenyl group is part of the polymer backbone. The linking nitrogen or oxygen is connected by a single bond to the carbonyl carbon, and the linking nitrogen or oxygen is also connected to the organic substituent tether for the OS compound.

Figure 13:
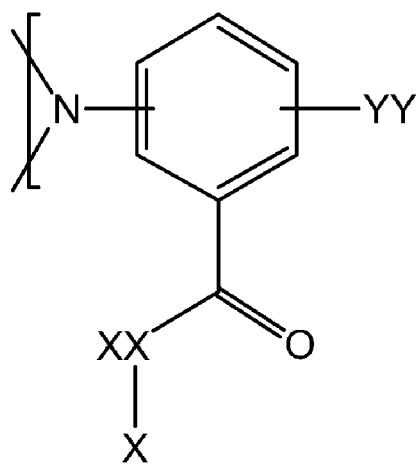
FIG. 13 depicts a non-terminal phenyl group of the polymer backbone, with an OS compound labeled X connected with an ester or amide linkage, labeled XX.
Figure 14:
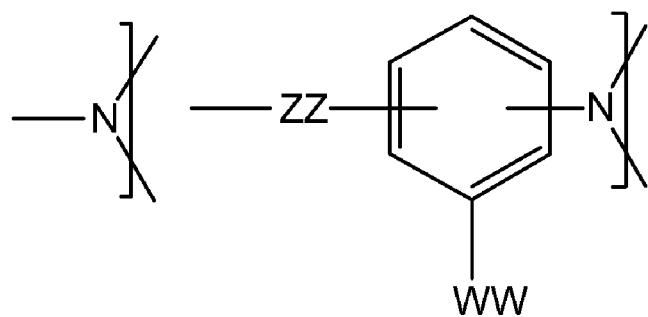
FIG. 14 depicts different structures that represent the symbol YY in FIG. 13, with ZZ representing a direct bond, —O—, —S—, —SO—, —SO$_2$—, —CH$_2$—, —CF$_2$—, —C(CH$_3$)$_2$—, —(CF$_3$)$_2$—, —(CH$_2$)$_n$—, —(CH$_2$CHCH$_3$O)$_n$—, —((CH$_2$)$_4$O)$_n$—, —(Si(CH$_3$)$_2$O)$_n$—, —(SiH(CH$_3$)O)$_n$—, —(SiH(C$_6$H$_5$)O)$_n$—, or —(Si(C$_6$H$_5$)$_2$O)$_n$—.
Figure 15:
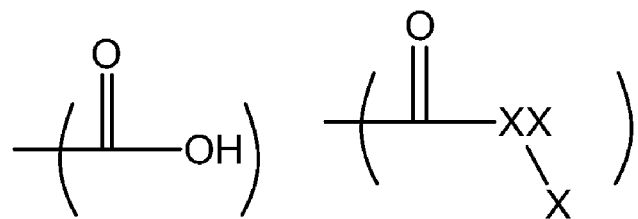
FIG. 15 depicts possible structures which are represented by the "WW" in FIG. 14.

By using the process described above, a polyimide polymer is formed which contains either an amide or ester linking a non-terminal phenyl group to the OS compound. This section of the polymer is shown in FIG. 13. The nitrogen in FIG. 13 is from the imide bond in the polymer backbone, XX represents either an oxygen atom or a nitrogen atom with an attached hydrogen, depending on if the OS group is attached by forming an ester or an amide, respectively. The symbol X represents an OS compound, including a tether between the XX atom and the OS compound. FIG. 14 depicts different structures that represent the symbol YY in FIG. 13. These different structures depend on the diamino monomers selected for the polyimide polymer. The symbol WW in FIG. 14 represents either a hydrogen atom, a free carboxylic acid, or another amide or ester linkage with an attached OS compound, as shown in FIG. 15, wherein XX again represents either nitrogen with an attached hydrogen or oxygen. The symbol ZZ in FIG. 14 represents a direct bond, —O—, —S—, —SO—, —SO$_2$—, —CH$_2$—, —CF$_2$—, —C(CH$_3$)$_2$—, —(CF$_3$)$_2$—, —(CH$_2$)$_n$—, —(CH$_2$CHCH$_3$O)$_n$—, —((CH$_2$)$_4$O)$_n$—, —(Si(CH$_3$)$_2$O)$_n$—, —(SiH(CH$_3$)O)$_n$—, —(SiH(C$_6$H$_5$)O)$_n$—, or —(Si(C$_6$H$_5$)$_2$O)$_n$—. In these Figs., an atom shown connected to a phenyl group through a bond, instead of at the hexagon angles representing carbon atoms, is meant to depict that atom connected to any available carbon atom in the phenyl group, and not to a specific carbon atom.

Process

The process for creating the final polymer should involve as few reactions and as few isolations as possible to maximize the overall efficiency. Minimization of the number of vessels or pots which are used during the production process also tends to improve efficiency, because this tends to minimize the number of reactions and/or isolations of the polymer.

The first step is forming the polyimide polymer backbone. Some of the basic requirements for this polymer backbone are that it be soluble, that it include an attachment point, and that it has many of the desirable characteristics typical of polyimide polymers. Typically, the diamino monomers will be dissolved in a solvent, such as dimethylacetamide [DMAc]. After the diamino monomers are completely dissolved, the dianhydride monomer is added to the vessel and allowed to react for approximately 4 to 24 hours. The use of an end capping agent, such as a monoanhydride or a monoamine, is not preferred until after the polymerization reaction is allowed to proceed to completion. At that point, the addition of phthalic anhydride or other monoanhydride end-capping agents can be used to react with remaining end group amines. Adding end capping agents during the polymerization reaction tends to shorten the polymer chains formed, which can reduce desirable mechanical properties of the resultant polymer. For example, adding end capping agents during the polymerization reaction can result in a more brittle polymer.

At this point the monomers have reacted together to form a polyamic acid. It is desired to convert the polyamic acid to a polyimide. The conversion of the polyamic acid to the polyimide form is known as imidization, and is a condensation reaction which produces water, as seen in FIG. 2. Because water is a by-product of a condensation reaction, and reactions proceed to an equilibrium point, the removal of water from the reaction system pushes or drives the equilibrium further towards a complete reaction because the effective concentration of the by-product water is reduced. This is true for chemical reactions generally, including condensation reactions.

The water can be removed from the reaction vessel chemically by the use of anhydrides, such as acetic anhydride, or other materials which will react with the water and prevent it from affecting the imidization of the polyamic acid. Water can also be removed by evaporation. One imidization method involves the use of a catalyst to chemically convert the polyamic acid to the polyimide form. A tertiary amine such as pyridine, triethyl amine, and/or beta-picolline is frequently used as the catalyst. Another method previously discussed involves forming the polyamic acid into a film which is subsequently heated. This will vaporize water as it is formed, and imidize the polymer.

A third imidization method involves removing the formed water via azeotropic distillation. The polymer is heated in the presence of a small amount of catalyst, such as isoquinoline, and in the presence of an aqueous azeotroping agent, such as xylene, to affect the imidization. The method of azeotropic distillation involves heating the reaction vessel so that the azeotroping agent and the water distill from the reaction vessel as an azeotrope. After the azeotrope is vaporized and exits the reaction vessel, it is condensed and the liquid azeotroping agent and water are collected. If xylene, toluene, or some other compound which is immiscible with water is used as the azeotroping agent, it is possible to separate this condensed azeotrope, split off the water for disposal, and return the azeotroping agent back to the reacting vessel.

If water is removed from the reaction vessel as a vapor it is possible to proceed with the addition of the OS group without isolating the polyimide polymer formed. However, if the water is chemically removed, it is preferred to precipitate, filter, and possibly wash the polyimide before adding the OS group. If the polymer is precipitated, the filtered solid polyimide is used as a feed stock in the next step. It should be noted that when reference is made to isolating a polyimide, it refers to the isolation of a polyimide at one point in the entire production process. For example, if a polyimide was formed from the basic monomers, then precipitated and filtered, and then washed several times, this would count as a single isolation and purification, even though several washes were performed. Two isolations would be separated by a reaction step.

The OS group is connected to the polyimide back bone previously formed. One of the first steps is finding a suitable solvent to dissolve the OS group as well as the polyimide polymer. Some examples of suitable solvents include: methylene chloride, chloroform, and possibly tetrahydrofuran (THF). One way to control the amount of OS that is incorporated into the polymer is by controlling the amount of monomer with an attachment point which was included in the formation of the polyimide polymer. Another way would be to limit the amount of OS added. If OS is added at a stoichiometric quantity lower than the available attachment points, then there would be free attachment points remaining. These free attachment points could be used for cross linking with other polymer chains, or they could be used for other purposes. Preferably, the OS group is a monofunctional group with one functional group for attachment to the polymer back bone. Preferably this functional group is an amine or alcohol, which will combine with the preferred carboxylic acid that is available as the attachment point on the polymer back bone.

If the OS group includes two or more functional groups, different polymer chains can be cross linked through this OS group. For this to happen, the OS group would be linked to two separate polymer chains. An amine on the OS group can be reacted with the carboxylic acid on the polymer chain to form an amide bond. This is a condensation reaction in which water is produced as a byproduct. In order to drive the reaction to completion it is desirable for the water to be removed from the reaction system. This can be facilitated with a dehydrating agent, such as dicyclohexylcarbodiimide, followed by subsequent isolation of the polyimide polymer. Additionally, this amide-forming reaction can be facilitated with an acid catalyst. If the OS compound contains an alcohol for reacting with the carboxylic acid, water is still produced as a byproduct and removing the water will tend to drive the reaction to completion.

An alternate possibility is to remove the water via azeotropic distillation from the reaction vessel. This can be done by adding or by continuing to use an azeotroping agent such as xylene or toluene, then vaporizing the water, separating the water from the reaction vessel, and discarding the water after it has exited the reaction vessel. This is similar to the process described above for the imidization reaction.

The current process includes up to two isolations of the polyimide polymer. The first possible isolation is after the polymer imidization reaction, and the second possible isolation is after the OS group has been attached to the polyimide polymer. The azeotropic removal of water in the vapor form during a condensation reaction eliminates the need for a subsequent isolation. Therefore, if vaporous water is azeotropically removed during one of either the polymer imidization reaction or the OS attachment reaction, the number of isolations needed for the production of the final OS containing polymer is reduced to one. If vaporous water is removed after both of the above reactions, it is possible to produce the final product with no isolations.

By using a carboxylic acid as the attachment point on the polyimide polymer and an amine or an alcohol as the functional group on the OS, it is possible to connect the OS group to the polymer back bone using gentle reaction conditions. For example, the reaction conditions for a carboxylic acid/amine attachment do not require rigorous material purity or dryness, and/or could be completed at the relatively low temperature of approximately 25 degrees Celsius. Similar conditions are possible if an alcohol is reacted with the carboxylic acid attachment point.

It should be noted that the cost of the OS compounds can be high and so the use of a very efficient means for connecting the OS group to the polyimide polymer is desired. The carboxylic acid and amine group connection is very efficient in terms of OS attachment to the polyimide, and can be utilized to produce connection efficiencies in the range of about 73% to about 99%. After the OS group has been connected to the polyimide polymer, the product can be stored for use at a later time or it can be used immediately to produce polymer films or other desired polymer articles.

Polymer Uses

The polyimide polymer produced as described above can be used for several specific purposes. One important characteristic to consider is the color of the polymer. Polyimide polymers usually absorb the shorter wavelengths of light up to a specific wavelength, which can be referred to as the 50% transmittance wavelength (50% T). Light with wavelengths longer than the 50% transmittance wavelength are generally not absorbed and pass through the polymer or are reflected by the polymer. The 50% T is the wavelength at which 50% of the electromagnetic radiation is transmitted by the polymer. The polymer will tend to transmit almost all the electromagnetic radiation above the 50% T, and the polymer will absorb almost all the electromagnetic radiation below the 50% T, with a rapid transition between transmittance and adsorption at about the 50%. T wavelength. If the 50% T can be shifted to a point below the visible spectrum, the polymer will tend to be very clear, but if the 50% T is in or above the visible spectrum, the polymer will be colored.

Generally, the factors that increase the solubility of a polymer also tend to push the 50% T lower, and thus tend to reduce the color of a polymer. Therefore, the factors that tend to reduce color in a polymer include flexible spacers, kinked linkages, bulky substituents, and phenyl groups which are aligned in different planes. The current invention provides a polyimide polymer with very little color.

A polyimide polymer with low color is useful for several applications. For example, if a polyimide is used as a cover in a multi layer insulation blanket on a satellite, the absence of color minimizes the amount of electromagnetic radiation that is absorbed. This minimizes the heat absorbed when the polymer is exposed to direct sunlight. Temperature variations for a satellite can be large, and a clear polyimide polymer, especially one that is resistant to AO degradation, provides an advantage.

Display panels need to be clear, so as not to affect the quality of the displayed image. The current invention is useful for display panels. In addition to optical clarity, a display panel should have low permeability to water and oxygen, a low coefficient of thermal expansion, and should be stable at higher temperatures. Thermal stability at 200 degrees centigrade is desired, but stability at 250 degrees centigrade is preferred, and stability at 300 degrees centigrade is more preferred. The surface of the current polymer can be glassified by exposing the surface to an oxygen plasma. This causes the OS groups to degrade to a glass type substance, which tends to coat and protect the surface of the polymer. This glass layer is thin enough that the layer bends and flexes without breaking. The glassified layer protects the polymer, and if the glassification layer is thick enough it could lower the permeability of the resultant polymer to water and oxygen. After the surface of the OS containing polymer is glassified, the permeability to oxygen and water vapor tends to be reduced, so the need for additional measures to lower this permeability are reduced or eliminated. One example of an additional measure which could be used to lower permeability is to thicken the glassification layer by depositing silicon oxide on the surface of the film. The effects of any traces of color in the polymer are minimized by supplying the polymer in a thin film, such as 1 mil thick. Thicker films are more durable, but they are also heavier and tend to have greater color effects, with the opposite being true for thinner films.

Polyimide films tend to be very strong, so they can be used as protective covers. For example, sheets of polyimide film can be placed over solar panels to protect the panels from weather and other sources of damage. For a solar panel to operate properly, it has to absorb sunlight. Polyimide polymers with low color are useful to protect solar panels and other items where a view of the protected object is desired.

EXAMPLES

Example 1

To a clean, dry, 5 liter (l) reactor equipped with an overhead stirrer, thermometer, and rubber septa were added 428.26 grams (g) APB, 81.88 g DBA, and 5591.08 g DMAc. The reactor was sealed and purged with dry argon while the solution was stirred vigorously with the overhead stirrer until the regents dissolved. To this solution was added 898.76 g 6FDA, and the resultant slurry was stirred for 24 hours, at which point 13.78 g phthalic anhydride (PA) was added to the reaction vessel and allowed to react for 4 hours. 501.18 g pyridine and 646.84 g acetic anhydride were added to this solution. The solution was stirred for 24 hours at room temperature, 24 hours at 70° C., then cooled to room temperature and precipitated in deionized water. The recovered polymer, which is referred to as SPC, was washed three times with water, and dried overnight in a vacuum oven at 100° centigrade (C.) to yield 1374.81 g dry SPC (98% yield).

To a clean, dry, 5 L reactor equipped with an overhead stirrer, thermometer, and rubber septa were added 900.00 g of SPC prepared as described above and 5406.75 g dichloromethane (DCM). The reactor was sealed and purged with dry argon while the solution was stirred until homogeneous. 398.75 g aminopropylisobutyl polyhedral OS, 86.55 g Dicyclohexyl carbodiimide (DCC), and 1802.25 g DCM, and 891.00 g dimethylacetamide (DMAc) were added to this solution. The reaction was allowed to proceed for 24 hours at room temperature. The reactor was then cooled to 0° C. for three hours during which time the contents became heterogeneous. The contents of the reactor were drained, and filtered to remove the precipitate. The recovered polymer solution was precipitated into ethanol, recovered, and rinsed three times with deionized water. The OS-containing polymer was then dried in a vacuum oven at 110° C. for 48 hours to yield 1148.30 g dry polymer (94% yield).

Example 2

To a clean, dry, 5 L reactor equipped with an overhead stirrer, thermometer, and rubber septa were added 1050.00 g of SPC prepared in Example 1 and 4000.00 g tetrahydrofuran (THF). The reactor was sealed and purged with dry argon while the solution was stirred until homogeneous. 403.18 g aminopropylisobutyl polyhedral OS, 87.51 g DCC, and 2090.00 g THF were added to this solution. The reaction was allowed to proceed for 24 hours at room temperature. The reactor was then cooled to 0° C. for three hours during which time the contents become heterogeneous. The contents of the reactor were drained, and filtered to remove the precipitate. The recovered polymer solution was precipitated into deionized water, recovered, and rinsed three times with deionized water. The OS-containing polymer was then dried in a vacuum oven at 110° C. for 48 hours to yield 1207.90 g dry polymer (98% yield).

Solar Panels

Figure 16:
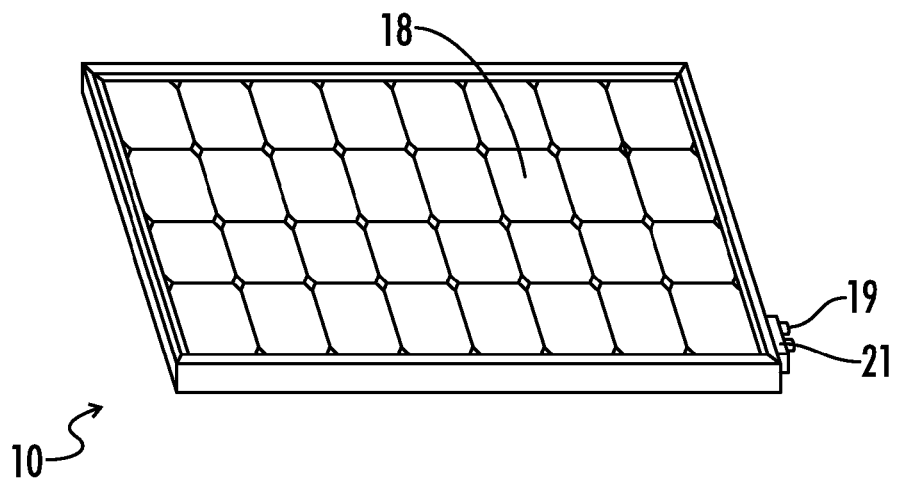
FIG. 16 depicts one embodiment of a solar panel.
Figure 17:
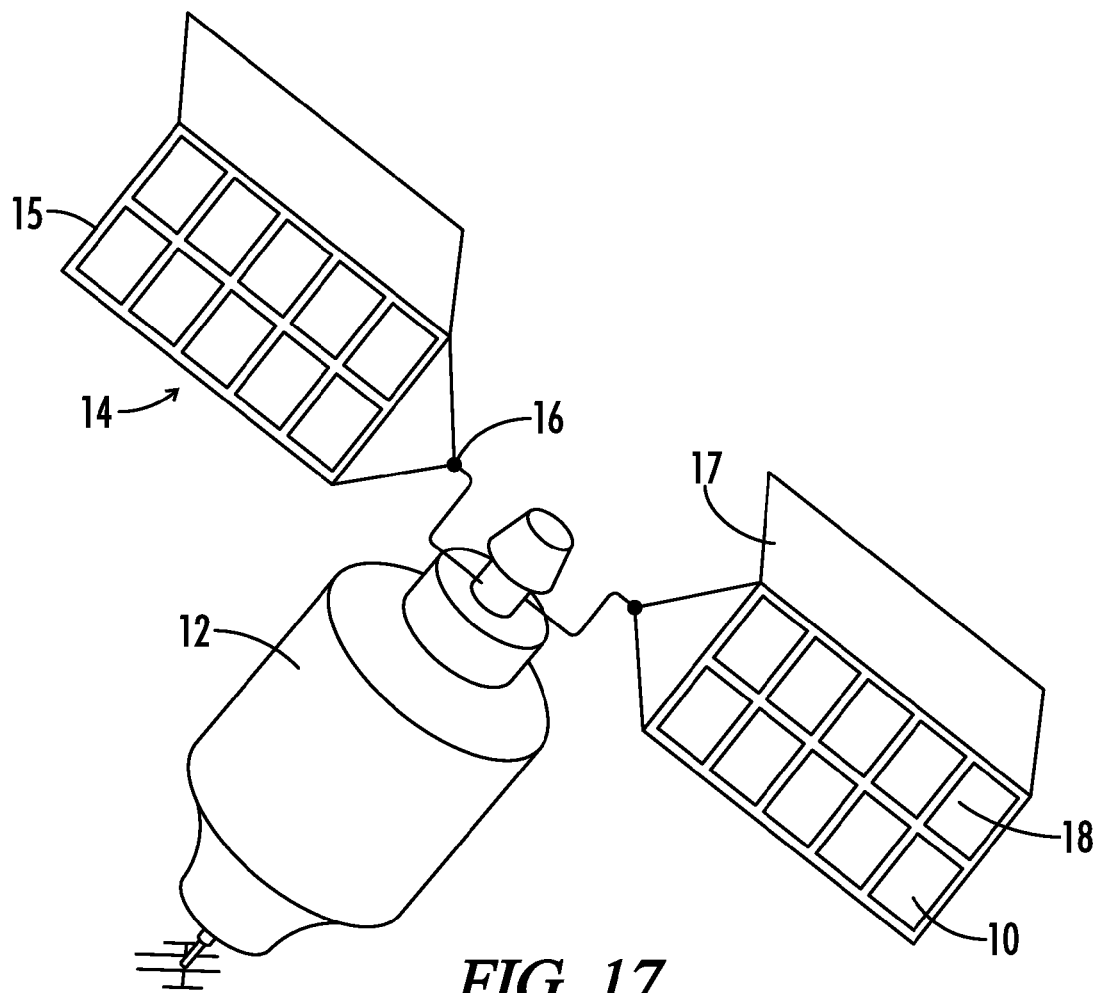
FIG. 17 depicts a satellite with attached solar panel arrays.

A solar panel 10 can be used to produce heat or electricity from a light source, including the sun, as shown in FIGS. 16 and 17. Solar panels 10 are particularly useful for providing energy to remote locations, but solar panels 10 can also be used to provide energy to readily available locations like houses and industrial complexes. Solar panels 10 can provide electricity for an airplane 32, an airship 34, or a satellite 12 or other spacecraft, as seen in FIGS. 16-20. Often, solar panels 10 will be deployed in an array 14, which is essentially a collection of more than one solar panel 10. The array 14 may provide increased amperage and/or voltage than a single solar panel 10. An array 14 may be supported by a truss 15, which provides a support and a connection point between the array 14 and the satellite 12. Alternatively, a solar panel 10 or an array 14 can be mounted directly to the surface of a vessel, such as to an aircraft wing or the top surface of an airship 34. In some embodiments, a reflective surface 17 can be supported near the array 14 to direct additional sunlight to the solar panels 10. The reflective surface 17 can be supported by the truss 15, or by other structures.

Aircraft and/or spacecraft are often assembled on the ground, and then launched into service, typically from a runway, another aircraft, or a rocket. This subjects the aircraft, or spacecraft to stress and vibration from the thrust of the launch. The cost of launching a vehicle, cargo, and payload into service is relatively high, so products which reduce weight are desired. Once in service, the airplane 32, airship 34, satellite 12, or other spacecraft can be placed in orbit, or it can be moved to various destinations as desired. An array 14 can be launched in a collapsed state, and then unfurled later. This saves room in the launch vehicle, yet provides a relatively large surface area for collecting sunlight to convert into electricity. An array 14 in an airplane 32, airship 34, satellite 12, or other spacecraft may be rotated or tilted as the aircraft or spacecraft moves relative to the light source to keep the solar panels 10 facing towards the light source. This can involve the use of a joint 16, gimbal, or other device, which may be powered by energy collected from the solar panels 10.

Airships 34 can be launched using lighter than air gases. The lifting force of the lighter than air gases must be greater than the weight of the materials used in the airship 34 as well as its cargo or payload. Generally, the volume, and therefore the lifting force, of an airship 34 exhibits a higher order dependency on the physical size of the airship 34 than the weight of the materials used in the airship 34, so a larger airship 34 can generally carry a heavier cargo or payload. Reducing the weight of solar panels 10 can reduce the overall weight of an airship 34, which may allow for the use of smaller airships 34 for the same cargo. Smaller airships 34 may be advantageous for several reasons, include the use of less material to build the airship 34, which can reduce total cost; smaller airships 34 are not as easily seen, which can reduce complaints based on aesthetics; smaller airships 34 may be more difficult to target for military purposes; smaller airships 34 may be more maneuverable, which can be useful for commercial and military purposes; and smaller airships 34 may be less likely to be involved in mid-air collisions.

Many events can damage solar panels 10. The solar panels 10 can be damaged when unfurled, especially if something in the unfurling process does not operate as planned. The large surface area of an array 14 increases the chances of impact from a micrometeor, micrometeorite, or other space debris. Stresses from the launch can also damage a solar panel 10. It may be easier to damage a brittle protective cover than a flexible one, and/or any damage may be more severe for a brittle protective cover than for a flexible cover. A solar panel 10 on an aircraft or spacecraft has many opportunities to be damaged, including stress from the launch, pre-launch damage, unfurling issues, and impacts from objects in space.

Since solar panels 10 are used to convert electricity from sunlight, they are exposed to the full spectrum of the sunlight at that location, including the ultraviolet wavelengths that have not been filtered by the atmosphere. These UV wavelengths are damaging to many polymer materials which often require the addition of UV stabilizers to increase their service lifetime. Polymeric materials used in solar arrays that are exposed to UV must withstand the UV.

"High altitude environments" is defined to include altitudes above 20,000 ft, the stratospheric near-space environment, and space. In these high altitude environments, there is less atmosphere to filter the UV light, or to filter the vacuum ultraviolet (VUV) light. Direct exposure to the UV and VUV light emitted by the sun can be very damaging for many materials, including most polymers. On Earth's surface, much of the UV and VUV are filtered by the atmosphere, which makes this form of radiation far less intense and damaging than in high altitude environments. Atomic oxygen presents an additional hazard in space. Atomic oxygen is present in low earth orbit, and atomic oxygen can degrade materials quickly. Satellites 12 orbiting in low earth orbits should have materials capable of withstanding exposure to atomic oxygen. The harsh environment of space requires special materials to protect solar panels 10 and other items.

Solar panels 10 have been used for some time. The solar panel 10 includes a face 18, which is the portion of the solar panel 10 directed towards the light source to gather light. The face 18 is the portion of the solar panel 10 that exposes elements of the solar panel 10 to the light source so that light can be converted to electricity. The sun is one example of a light source, but other light sources could be used as well. There may be supportive side surfaces and a supportive back surface of a solar panel 10 to comprise a frame, and the frame can be made of opaque materials. A wide variety of materials can be used to construct the frame because light does not need to pass through The materials used for the frame can be selected to be resistant to atomic oxygen corrosion and damage from UV and VUV light, and to provide the necessary support for the solar panel 10. Different embodiments of solar panels 10 can be flexible or rigid, and a solar panel can include electrical contacts 19 and a controller 21 to facilitate use of electricity produced by the solar panel 10.

Figure 18:
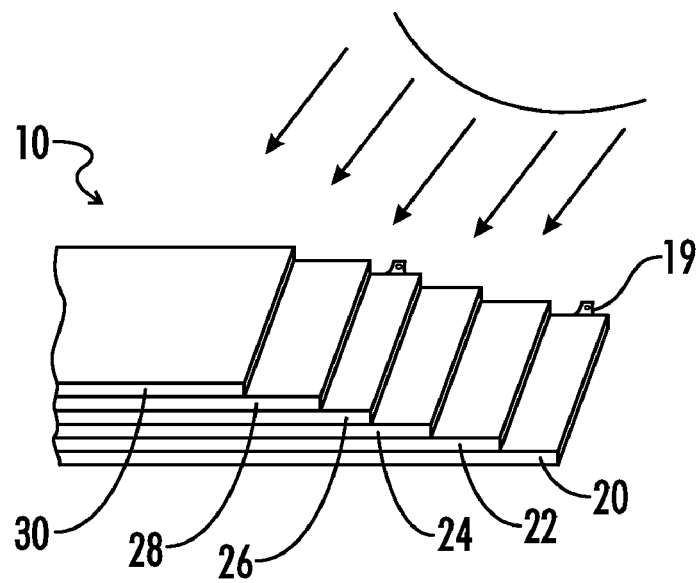
FIG. 18 depicts the layers of one embodiment of a solar panel, where the various layers are cut away at different locations to better show the solar panel structure.
Figure 19:
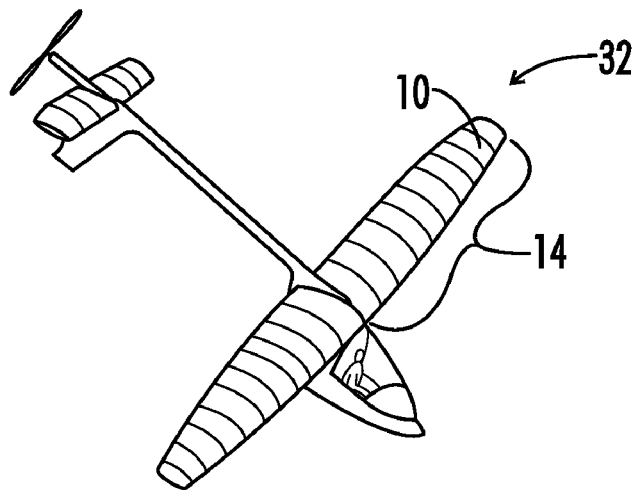
FIG. 19 depicts an airplane with attached solar panels.
Figure 20:
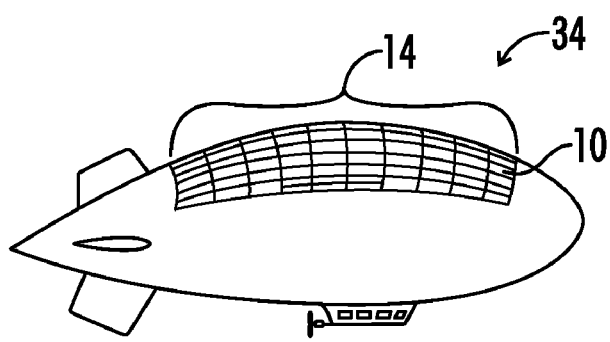
FIG. 20 depicts an airship with attached solar panels.

The face 18 of a solar panel 10 permits the transmission of light to the underlying layers. One embodiment of a solar panel 10 is shown in FIG. 18, with the various layers cut away at different points to show the structure. A back contact layer 20 provides an electrical contact to an adjacent P-type semiconducting layer 22. An N-type semiconducting layer 24 is adjacent to the P-type semiconducting layer 22. The N-type semiconducting layer 24 can be silicon which is doped with certain impurities to provide a voltage when light is absorbed. The P-type semiconducting layer 22 can be doped with other impurities so that electrons are accepted into the P-type semiconducting layer 22. A contact grid 26 is positioned above the N-type semiconducting layer 24, so current can flow through an outside circuit between the contact grid 26 and the back conducting layer 20. The contact grid 26 and the back conducting layer 20 are in contact with the P and N type semiconducting layers 24, 22 to complete the current flow. Silicon can be reflective, so an anti-reflective coating 28 can be used to help absorb light. On top of the anti-reflective coating 28 can be a polymeric coating 30 to protect the solar panel face 18. Other solar panel embodiments are also possible, including solar panels which do not use silicon. Those skilled in the art will recognize a wide variety of solar panel variations are possible within the scope of the present invention.

The polymeric coating 30 provides protection for the solar panel 10. The polymeric coating 30 may be the outermost layer on the solar panel face 18, so sunlight may strike the polymeric coating 30 before passing to any other layers of the solar panel 10 underneath. The polymeric coating 30 is positioned over the face 18, and can be directly connected to the face 18 with or without adhesive or suspended near the face 18. The polymeric coating 30 can include antireflective additive or an antireflective coating to help reduce light loss from reflection. Any corrosive compounds or other damaging items also contact the polymeric coating 30 before any layers underneath. Therefore, incident UV and VUV light must pass through the polymeric coating 30 before reaching the various components and layers underneath. Atomic oxygen also must pass through the polymeric coating 30 before reaching the inner portions of the solar panel 10.

The polymeric coating 30 serves to protect the underlying portions of the solar panel 10. The polyimide polymer described above is included in the polymeric coating 30. Therefore, the method of producing the solar panel 10 includes providing the solar panel 10, and protecting the face 18 with the polymer coating. This can include applying the polymer coating 30 directly to the solar panel face 18. The polymer coating 30 can be applied as a liquid and cured on the solar panel face 18, or it can be made into a film and either placed or adhered to the face, as desired. Curing of the polymer coating 30 when applied as a liquid may primarily involve heating to evaporate the solvent, which can use a lower temperature than heating to imidize a polyamic acid. In an alternative embodiment, the polymer coating 30 can be suspended near the underlying layers.

A polyimide polymer as described above is included in the polymeric coating 30. The polymeric coating 30 may contain other polymers, additives, or additional components as well, or the polymeric coating 30 can be formed entirely from the polyimide polymer described above. The polymer included the polymeric coating 30 is produced by reacting at least one acid monomer with at least one diamine monomer to form a polyamic acid polymer backbone, where the monomers are selected such that the polyamic acid polymer backbone includes a non-terminal attachment point. Next, the polyamic acid polymer backbone can be imidized to produce the polyimide polymer. An oligomeric silsesquioxane (OS) compound can be attached to the attachment point on the polyimide polymer backbone. The OS compound can be attached by reacting a functional group connected to the OS compound with the attachment point. The attachment point can be a carboxylic acid, and the function group can be an amine, an alcohol, or other functional groups. In some embodiments, the polymer backbone, in either the polyamic acid form or the polyimide form, is isolated a maximum of one time. As discussed above, other embodiments of polyimides with OS are also possible.

This provides a polymeric coating 30 that covers the solar panel face 18. The polymeric coating includes a polyimide polymer with at least one non-terminal phenyl group. The non-terminal phenyl group is connected to a linkage, which can be an amide linkage formed by the reaction of the carboxylic acid attachment point with an amine functional group connected to the OS. The linkage can also be an ester linkage formed by the reaction of the carboxylic acid attachment point with an alcohol functional group connected to the OS. The polyimide polymer may also contain a mixture of amide and ester linkages by including OS with both alcohol and amine functional groups, either simultaneously or sequentially. In alternate embodiments, the OS may be blended in a polyimide matrix, the OS may be in a polyimide backbone, or the OS may be tethered to a polyimide backbone in various ways.

The polymeric coating 30 has several desirable properties. The polymeric coating 30 is light weight, which can reduce cargo weight for a solar panel 10 or a solar panel array 14. The polymeric coating 30 is flexible, so impacts, vibrations, or other stresses will not cause breaks or cracks as readily as some less flexible materials. The polymeric coating 30 can be 1 mil thick, so it occupies very little space in the launch vehicle. The polymeric coating 30 can also be other thicknesses, as desired. The polymeric coating 30 transmits visible light and may transmit some UV light, so the efficiency of the solar panel 10 is not significantly reduced by the polymeric coating 30. Also, the polymeric coating 30 provides protection to the solar panel 10 from atomic oxygen and most UV and VUV light, as well as providing a top protective layer of the face 18.

The polymeric coating 30 provides additional benefits as well. The polyimide is soluble, so it can be dissolved in a solvent and applied onto a solar panel 10 in solution. The polymeric coating 30 can then be cured by simply evaporating the solvent, which can be at lower temperatures than those necessary for imidizing a polyamic acid. For example, some solvents such as tetrahydrofuran, methylene chloride, chloroform, acetone, methyl ethyl ketone, methyl isobutyl ketone, monoglyme, diglyme, and many other solvents can be evaporated from a polymeric solution at a temperature not exceeding 23 degrees centigrade, so the polymeric coating 30 can be cured on the solar panel 10 at a temperature not exceeding 23 degrees centigrade. In alternate embodiments, solvents can be evaporated from the polymeric solution at a temperature not exceeding 50 degrees centigrade, or at a temperature not exceeding 100 degrees centigrade, or alternatively at a temperature not exceeding 150 degrees centigrade, or at almost any maximum temperature desired where the solvent will evaporate. A solvent can be evaporated at a temperature below the solvent boiling point, so low temperatures can be used to evaporate the solvent and cure the polymeric coating 30. Generally, lower temperatures require a longer period to evaporate solvent, so a lower cure temperature may increase the required cure time. Some solar panels 10 may be temperature sensitive, so reduced cure temperatures can prevent damage to the solar panel 10. It is generally possible to cure a polymeric coating 30 at a safe temperature for the solar panel 10 by adjusting the cure time and/or the solvent used. Other factors can also impact the cure time, such as air flow over the curing polymeric coating 30 and the polymeric coating thickness.

The current invention has additional advantages. In some embodiments, the polyimide can be easily transported and stored as a solid for extended periods, which provides simpler logistics than for a relatively unstable polyamic acid. Oligomeric silsesquioxane is incorporated into the polyimide, so the polymeric coating 30 will exhibit self-healing upon exposure to atomic oxygen. The OS forms a passivating silica layer when exposed to atomic oxygen. If this layer is scratched or broken, the exposed polyimide below forms another passivating silica layer when exposed to atomic oxygen. This helps to minimize harm caused by scratches or other damage to the polymer coating 30. Additionally, the polyimide will not yellow as rapidly as many other polymers when exposed to UV, so the effective life of the solar panel 10 is not shortened as much as with other polymers. Yellowing is a gradual increase in the color of a polymer over time.

CONCLUSION

The solar panel 10 described has several desirable properties. These include relatively light weight, durability, relatively small storage space, ease of application for the polymeric coating 30, and protection of the solar panel 10.

While the invention has been described with respect to a limited number of embodiments, those skilled in the art, having benefit of this disclosure, will appreciate that other embodiments can be devised which do not depart from the scope of the invention as disclosed here. Accordingly, the scope of the invention should be limited only by the attached claims.

What is claimed is:

1. A method of protecting a solar panel comprising:
   (a) providing a solar panel with a face for collecting light;
   (b) protecting the face with a polymeric coating, where the polymeric coating includes a polyimide polymer produced by:
      (i) reacting at least one acid monomer with at least one diamine monomer to form a polyamic acid backbone, where the monomers are selected such that the polyamic acid backbone includes a non-terminal attachment point;
      (ii) after step (i), imidizing the polyamic acid backbone to form a polyimide polymer backbone; and
      (iii) after step (ii), attaching an oligomeric silsesquioxane (OS) compound to the attachment point on the polyimide polymer backbone, such that the OS compound is connected to the polyimide polymer backbone.

2. The method of claim 1 where a polymer backbone is isolated a maximum of one time, where the polymer backbone includes the polyamic acid backbone and the polyimide polymer backbone.

3. The method of claim 1 further comprising positioning the solar panel in the presence of atomic oxygen.

4. The method of claim 1 where the monomers are selected such that the polymeric coating is soluble.

5. The method of claim 1 where the solar panel is rigid.

6. The method of claim 1 where the OS is in the form of a polyhedron.

7. The method of claim 1 where a functional group is connected to the OS and the functional group is reacted with the attachment point to attach the OS to the polyimide polymer backbone, where the attachment point is comprised of a carboxylic acid and where the functional group is selected from the group consisting of an amine and an alcohol.

8. The method of claim 1 further comprising placing the solar panel in a high altitude environment.

9. The method of claim 1 where the polymeric coating produces a layer of silicon dioxide when exposed to atomic oxygen.

10. The method of claim 1 where the solar panel is flexible.

11. The method of claim 1 further comprising curing the polymeric coating on the solar panel at a temperature not exceeding 100 degrees centigrade.

12. A solar panel resistant to atomic oxygen attack comprising:
   a solar panel with a face for collecting light;
   a polymeric coating covering the face, where the coating includes a polyimide polymer comprising:
      a polyimide polymer backbone, where the polymer backbone includes at least one non-terminal phenyl group;
      a linkage selected from the group consisting of:
         an amide linkage comprising a carbonyl carbon and a linking nitrogen atom, wherein the carbonyl carbon is connected by a single bond to the non-terminal phenyl group in the polymer backbone and the linking nitrogen atom is connected by a single bond to the carbonyl carbon;
         an ester linkage comprising a carbonyl carbon and a linking oxygen atom, wherein the carbonyl carbon is connected by a single bond to the non-terminal phenyl group in the polymer backbone and the linking oxygen atom is connected by a single bond to the carbonyl carbon; and
         a combination of the amide linkage and the ester linkage;
   at least one oligomeric silsesquioxane (OS) compound comprising silicon atoms and oxygen atoms connected together, and
   an organic substituent connected to each silicon atom of the OS compound, wherein at least one organic substituent is connected to the linkage.

13. The solar panel of claim 12 where the solar panel comprises silicon.

14. The solar panel of claim 12 where the polyimide monomers are selected such that the coating at a thickness not exceeding 1 mil has a 50% transmissivity at a wavelength of no more than 399 nanometers.

15. The solar panel of claim 12 where the OS is in the form of a polyhedron.

16. The solar panel of claim 12 where the polyimide polymer is soluble in solvents.

17. The solar panel of claim 12 where the polymeric coating protects the solar panel from atomic oxygen.

18. The solar panel of claim 12 where the solar panel is placed in a high altitude environment.

19. A solar panel resistant to atomic oxygen attack comprising:
a solar panel with a face for collecting light;
a polymeric coating positioned over the face, where the polymeric coating comprises a polyimide polymer having a polyimide polymer backbone including at least one unit represented by the following formula:

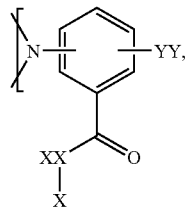

wherein X includes an oligomeric silsesquioxane (OS) compound, and XX is a nitrogen atom with a hydrogen atom attached to the nitrogen atom; wherein YY is selected from the group consisting of the compounds represented by the following formulas:

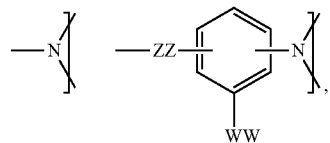

and wherein ZZ is selected from the group consisting of a direct bond, —O—, —S—, —SO—, —SO$_2$—, —CH$_2$—, —CF$_2$—, —C(CH$_3$)$_2$—, —(CF$_3$)$_2$—, —(CH$_2$)$_n$—, —(CH$_2$CHCH$_3$O)$_n$—, —((CH$_2$)$_4$O)$_n$—, —(Si(CH$_2$)$_2$O)$_n$—, —(SiH(CH$_3$)O)$_n$—, —(SiH(C$_6$H$_5$)O)$_n$—, and —(Si(C$_6$H$_5$)$_2$O)—, and wherein WW is selected from the group consisting of hydrogen and a compound represented by one of the following formulas:

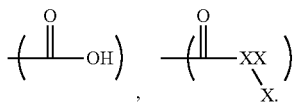

20. The solar panel of claim 19, wherein the polymer includes at least one unit selected from the group consisting of the compound represented by the following formula:

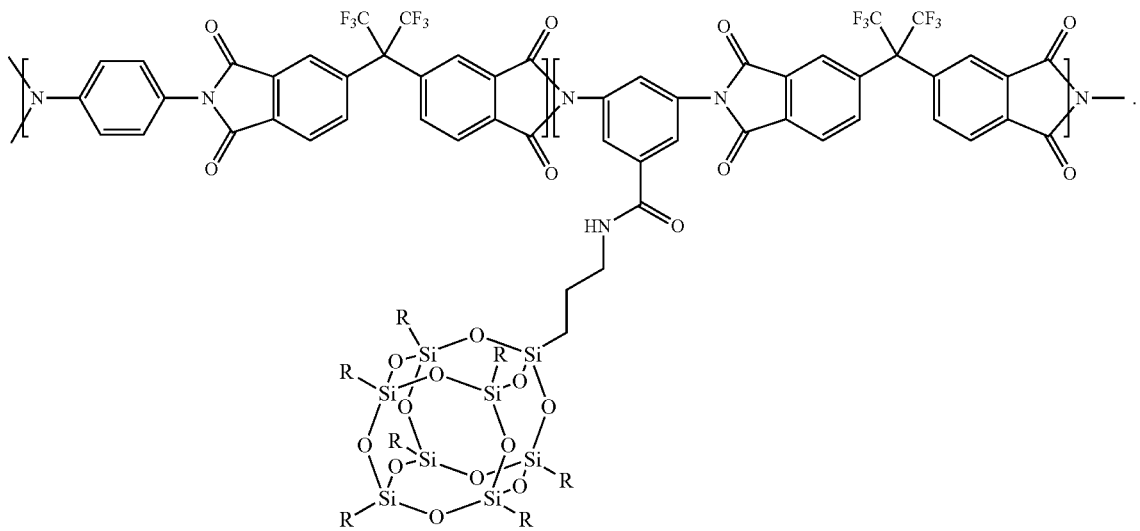

* * * * *